United States Patent
Luo et al.

(10) Patent No.: US 9,142,732 B2
(45) Date of Patent: Sep. 22, 2015

(54) LED LAMP WITH QUANTUM DOTS LAYER

(71) Applicants: Hong Luo, San Jose, CA (US); Shiyong Zhang, Acton, MA (US); Yiming Zhang, San Jose, CA (US)

(72) Inventors: Hong Luo, San Jose, CA (US); Shiyong Zhang, Acton, MA (US); Yiming Zhang, San Jose, CA (US)

(73) Assignee: OSRAM SYLVANIA Inc., Danvers, MA (US)

( * ) Notice: Subject to any disclaimer, the term of this patent is extended or adjusted under 35 U.S.C. 154(b) by 109 days.

(21) Appl. No.: 13/784,140

(22) Filed: Mar. 4, 2013

(65) Prior Publication Data

US 2014/0246689 A1  Sep. 4, 2014

(51) Int. Cl.
- H01J 1/62 (2006.01)
- H01J 63/04 (2006.01)
- H01L 21/00 (2006.01)
- H01L 33/50 (2010.01)

(52) U.S. Cl.
CPC ............. *H01L 33/504* (2013.01); *H01L 33/502* (2013.01)

(58) Field of Classification Search
USPC .......................... 313/112, 512; 257/81, 89, 98
See application file for complete search history.

(56) References Cited

U.S. PATENT DOCUMENTS

| | | | |
|---|---|---|---|
| 6,686,676 B2 * | 2/2004 | McNulty et al. | 313/112 |
| 6,890,777 B2 | 5/2005 | Bawendi et al. | |
| 7,102,152 B2 * | 9/2006 | Chua et al. | 257/14 |
| 7,210,977 B2 | 5/2007 | Ouderkirk et al. | |
| 7,495,383 B2 | 2/2009 | Chua et al. | |
| 7,737,621 B2 * | 6/2010 | Masuda et al. | 313/501 |
| 7,910,940 B2 * | 3/2011 | Koike et al. | 257/98 |
| 8,441,179 B2 * | 5/2013 | Pickard et al. | 313/501 |
| 2005/0057145 A1 * | 3/2005 | Shieh et al. | 313/503 |
| 2006/0113895 A1 * | 6/2006 | Baroky et al. | 313/501 |
| 2007/0221947 A1 | 9/2007 | Locascio et al. | |
| 2007/0246734 A1 | 10/2007 | Lee et al. | |
| 2007/0262714 A1 * | 11/2007 | Bylsma | 313/512 |
| 2008/0173886 A1 | 7/2008 | Cheon et al. | |
| 2010/0123155 A1 | 5/2010 | Pickett et al. | |

OTHER PUBLICATIONS

Optical thin-film materials with low refractive index for broadband elimination of Fresnel reflection, Xi et al., Nature Photonics, vol. 1 pp. 176-179 (pub'd online Mar. 1, 2007).

* cited by examiner

*Primary Examiner* — Mary Wilczewski
*Assistant Examiner* — Tsz Chiu
(74) *Attorney, Agent, or Firm* — Edward S. Podszus

(57) ABSTRACT

A lighting device 100 includes a light source 101, a first phosphor layer 102 disposed directly or indirectly on top of the light source 101, a first quantum dots layer 103 disposed directly on top of the first phosphor layer 101, and a second phosphor layer 104 disposed directly on top of the first quantum dots layer 103. The first quantum dots layer 103 includes a population of quantum dots 106 dispersed in a first matrix material 107. Each of the first and second phosphor layers 102, 104 includes a population of conventional phosphor particles 105. Another embodiment is a lighting device 400 that includes a light source 401 and a wavelength-shifting phosphor layer 402 disposed on top of the light source 401. The wavelength-shifting phosphor layer 402 includes a population of quantum dots 404 and a population of phosphor particles 403 both dispersed in a matrix material 405.

13 Claims, 4 Drawing Sheets

LED LAMP WITH QUANTUM DOTS LAYER

CROSS REFERENCE TO RELATED APPLICATIONS

Not applicable.

TECHNICAL FIELD

Light emitting diode ("LED") lamps containing conventional phosphors and quantum dots for converting the light emitted from a light source into a light of different wavelengths.

BACKGROUND

Existing LEDs can emit light in the ultraviolet ("UV"), visible or infrared ("IR") wavelength range. These LEDs generally have narrow emission spectra. It is desirable to use LEDs that can generate broader emission spectra to produce desired color light, such as white light. Due to the narrow emission spectrum, LEDs can not be directly used to produce broad-spectrum light. Phosphors can be introduced to convert portion of the light originally emitted by the LED into light of a different wavelength. The combination of the converted light and the originally emitted light renders a more desired output light. However, phosphors generally have narrow absorption spectra and can be only used on underlying light sources that have a very specific range of emission wavelengths. For example, the YAG:Ce phosphor is optimized for 460 nanometer ("nm") light but is not suitable for LEDs emitting light at other wavelengths. The white light converted by one type of phosphor typically has a low color rendering index ("CRI") and can only reach a limited range of color temperature.

Quantum dots ("QDs", also known as semiconductor nanocrystals) can be used to convert the light emitted by LEDs and to generate the light in the visible or infrared region. Quantum dots are small crystals of II-VI, III-V, IV-VI materials that typically have a diameter between 1 nm and 20 nm, which is smaller than the bulk exciton Bohr radius. Due to the quantum confinement effects, the energy differences between electronic states of a QD are a function of both the composition and the physical size of the QD. Thus, the optical and optoelectronic properties of QDs can be tuned and adjusted by changing the physical size of the QDs. The QDs absorb wavelengths shorter than the absorption onset wavelength and emit light at the absorption onset wavelength. The bandwidth of the QD luminescent spectra is related to temperature dependent Doppler broadening, Heisenberg Uncertainty Principle and the size distribution of the QDs. For a given QD, the emission band of the QD can be controlled by changing the size. Thus, the QD can produce a range of colors that are unattainable with conventional phosphors. For example, CdSe QD of 2 nm emits at the blue region and CdSe QD of 10 nm emits at the red region.

Due to the nano-scale size of the QDs, the QDs conversion layer is intrinsically a non-scattering layer. With lack of scattering, light has a much shorter optical path when it passes through a QDs layer than when the same light passes through a conventional phosphor layer. Unless the layer thickness is undesirably high, not enough light will be absorbed by the QDs to convert into a desired amount of emission at another wavelength. Therefore, an undesirably thick QD layer or high quantity of QDs would be needed to achieve the target color combination. Moreover, the optical path length is different at different angles of emission. For a QDs layer to convert light into the red region, the light at a smaller angle of emission has a shorter optical path and less red light is generated, meanwhile the light at a larger angle of emission results in more red light. Thus, the resulting output light has less red component in the center and more red component at the edge, which is disadvantageous in terms of color uniformity.

The following are known: U.S. Pat. No. 6,890,777 (Bawendi); US Pat. Pub. Nos. 2008/0173886 (Cheon), 2007/0246734 (Lee), 2010/0123155 (Pickett), and 2007/0221947 (Locascio); and the article "Optical thin-film materials with low refractive index for broadband elimination of Fresnel reflection", Xi et al., Nature Photonics, Vol. 1 pp. 176-179 (pub'd online 1 Mar. 2007).

SUMMARY

It is an object of the embodiments to provide a lighting device having both conventional phosphor and quantum dots and a reliable means of controlling and achieving the desired color and uniformity of the output light.

According to one aspect of the present disclosure, there is provided a lighting device 100 for emitting light. The lighting device 100 for emitting light includes a light source 101, a first conventional phosphor layer 102 disposed either directly or indirectly on top of the light source 101, a first quantum dots layer 103 disposed directly on top of the first phosphor layer 101, and a second conventional phosphor layer 104 disposed directly on top of the first quantum dots layer 103. The first quantum dots layer 103 includes at least one population of quantum dots 106 dispersed in a first matrix material 107. Each of first and second conventional phosphor layers 102, 104 includes at least one population of conventional phosphor particles 105.

According to another aspect of the present disclosure, there is provided a lighting device 100, wherein the average diameter of the conventional phosphor particles 105 is at least 20 times of the average diameter of the quantum dots 106.

According to another aspect of the present disclosure, there is provided a lighting device 100, wherein the average size of the conventional phosphor particles 105 is in a range of 1 micrometer to 100 micrometers.

According to another aspect of the present disclosure, there is provided a lighting device 100, wherein the quantum dots 106 comprise one or more of the materials CdS, CdSe, CdTe, CdPo, ZnS, ZnSe, ZnTe, ZnPo, HgS, HgSe, HgTe, MgS, MgSe, MgTe, PbSe, PbS, PbTe, GaN, GaP, GaAs, InP, InAs, $CuInS_2$, $CdS_{1-x}Se_x$, $BaTiO_3$, $PbZrO_3$, $PbZr_xTi_{1-x}O_3$, $Ba_xSr_{1-x}TiO_3$, $SrTiO_3$, $LaMnO_3$, $CaMnO_3$, or $La_{1-x}Ca_xMnO_3$.

According to another aspect of the present disclosure, there is provided a lighting device 100, wherein the light source 101 comprises a light emitting diode ("LED"), a laser diode, an organic light emitting diode, or a discharge lamp.

According to another aspect of the present disclosure, there is provided a lighting device 100, wherein the light emitting diode 101 is a blue light emitting diode or a UV light emitting diode.

According to another aspect of the present disclosure, there is provided a lighting device 100, wherein the first matrix material 107 comprises polymethyl methacrylate, polymer, condensation cure silicone, silicone, silica glass, silica gel, or glass.

According to another aspect of the present disclosure, there is provided a lighting device 100, wherein the first and second conventional phosphor layer 102, 104 comprises conventional phosphor particles 105 comprising YAG:Ce, and the first quantum dots layer 103 comprises quantum dots 106 having a red fluorescent spectrum.

According to another aspect of the present disclosure, there is provided a lighting device 100, wherein the first conventional phosphor layer 102 contains garnet-based phosphor, silicate-based phosphor, orthosilicate-based phosphor, thiogallate-based phosphor, sulfide-based phosphor, or nitride-based phosphor, the second conventional phosphor layer 104 contains garnet-based phosphor, silicate-based phosphor, orthosilicate-based phosphor, thiogallate-based phosphor, sulfide-based phosphor, or nitride-based phosphor.

According to another aspect of the present disclosure, there is provided a lighting device 100, wherein the first conventional phosphor layer 102, the second conventional phosphor layer 104 and the first quantum dots layer 103 contain scatterers 108.

According to another aspect of the present disclosure, there is provided a lighting device 100, wherein the average size of the scatterers 108 is in the range of 1 micrometer to 100 micrometers. The scatterers 108 preferably comprise $TiO_2$ or glass.

According to another aspect of the present disclosure, there is provided a lighting device 200. The lighting device 200 further comprises a second quantum dots layer 205 disposed directly on top of the second conventional phosphor layer 204. The second quantum dots layer 205 comprises at least one population of quantum dots 208 dispersed in a second matrix material 207. The third conventional phosphor layer 206 is disposed directly on top of the second quantum dots layer 205.

According to another aspect of the present disclosure, there is provided a lighting device 400 for emitting light. The lighting device 400 for emitting light includes a light source 401, and a wavelength-shifting phosphor layer 402 disposed either directly or indirectly on top of the light source 401. The wavelength-shifting phosphor layer 402 comprises at least one population of quantum dots 404 dispersed in a matrix material 405, and at least one population of conventional phosphor particles 403 dispersed in the matrix material 405. The average diameter of the conventional phosphor particles 403 are at least 20 times of the average diameter of the quantum dots 404.

According to another aspect of the present disclosure, there is provided a lighting device 400, wherein the average size of the conventional phosphor particles 403 is in a range of 1 micrometer to 100 micrometers.

According to another aspect of the present disclosure, there is provided a lighting device 400, wherein the quantum dots 404 comprise one or more of the materials CdS, CdSe, CdTe, CdPo, ZnS, ZnSe, ZnTe, ZnPo, HgS, HgSe, HgTe, MgS, MgSe, MgTe, PbSe, PbS, PbTe, GaN, GaP, GaAs, InP, InAs, $CuInS_2$, $CdS_{1-x}Se_x$, $BaTiO_3$, $PbZrO_3$, $PbZr_xTi_{1-x}O_3$, $Ba_xSr_{1-x}TiO_3$, $SrTiO_3$, $LaMnO_3$, $CaMnO_3$, or $La_{1-x}Ca_xMnO_3$.

According to another aspect of the present disclosure, there is provided a lighting device 400, wherein the light source 401 comprises a light emitting diode, a laser diode, an organic light emitting diode, or a discharge lamp.

According to another aspect of the present disclosure, there is provided a lighting device 400, wherein the light emitting diode 401 is a blue light emitting diode.

According to another aspect of the present disclosure, there is provided a lighting device 400, wherein the matrix material 405 comprises polymethyl methacrylate, polymer, condensation cure silicone, silicone, silica glass, silica gel, or glass.

According to another aspect of the present disclosure, there is provided a lighting device 400, wherein the conventional phosphor particles 403 comprises YAG:Ce, and the quantum dots 404 have a red fluorescent spectrum.

According to another aspect of the present disclosure, there is provided a lighting device 400, wherein the conventional phosphor particles 403 comprise garnet-based phosphor, silicate-based phosphor, orthosilicate-based phosphor, thiogallate-based phosphor, sulfide-based phosphor, or nitride-based phosphor.

According to another aspect of the present disclosure, there is provided a lighting device 400, wherein the wavelength-shifting phosphor layer 402 includes scatterers 408.

According to another aspect of the present disclosure, there is provided a lighting device 400, wherein the average size of the scatterers 408 is in a range of 1 micrometer to 100 micrometers. The scatterers 408 comprise $TiO_2$ or glass.

DESCRIPTION OF THE DRAWINGS

Reference should be made to the following detailed description which should be read in conjunction with the following figures, wherein like numerals represent like parts

DETAILED DESCRIPTION OF PREFERRED EMBODIMENTS

For a better understanding of the present embodiments, together with other and further objects, advantages and capabilities thereof, reference is made to the following disclosure and appended claims taken in conjunction with the above-described drawings.

While there have been shown and described what are at present considered to be preferred embodiments of the disclosure, it will be apparent to those skilled in the art that various changes and modifications can be made herein without departing from the scope thereof as defined by the appended claims.

Figure 1:
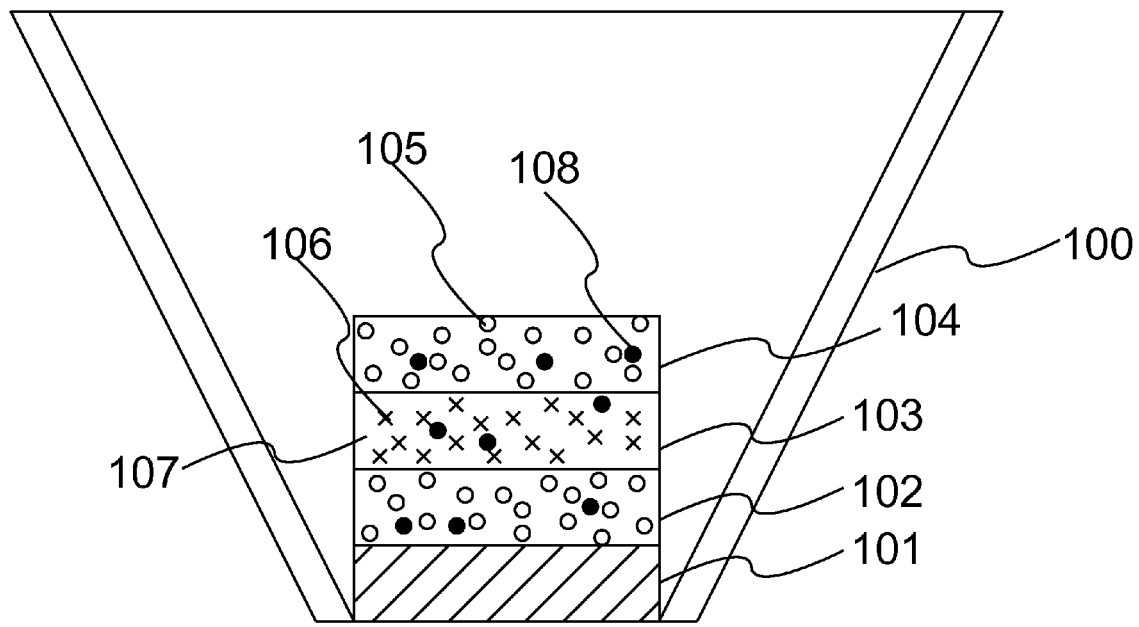
FIG. 1 is a schematic illustration of a lighting device according to a first embodiment of the present disclosure.

With reference to FIG. 1, a lighting device 100, such as a lamp, in accordance with a first embodiment is shown. The lighting device 100 includes a light source, which can be LEDs, laser diodes, organic LEDs or discharge lamps, preferably one or more LEDs. Lamp 100 includes driver electronics (not shown) connectable to a power supply for supplying the correct voltage to LED 101, as is known in the art. The lighting device 100 produces a broad-spectrum output light, such as a white light with a high color rendering index ("CRI"). The broad-spectrum output light has substantially uniform color and intensity. The broad-band output light is produced by converting some of the original light generated by the light source into light with longer wavelength using quantum dots and conventional phosphors. The wavelength deficiencies, that would exist were only conventional phosphors are used, are compensated for by the use of quantum dots. Thus, the broad-spectrum output light having higher CRI results.

As shown in FIG. 1, a blue LED chip 101 is the light source, preferably a GaInN LED chip, emitting light at the wavelength of about 430~485 nm. A first conventional phosphor layer 102 is directly on top of the LED chip 101. The term "directly" means that the conventional phosphor layer 102 is in direct contact of the surface of the blue LED chip 101. The first conventional phosphor layer 102 contains cool white phosphor particles 105 such as $Y_3AL_5O_{12}:Ce^{3+}$ to convert some of the blue light emitted from the LED chip 101 to the yellow region with a broad emission spectrum from 450 nm to 750 nm. The term "cool white phosphor" means that the combination of the blue light emitted from the blue LED chip 101 and the yellow light converted by the cool white phosphors forms the output white light with correlated color temperature ("CCT") that is higher than 4500K. Phosphor particles 105 are mixed into a polymer base material such as silicone or PMMA and formed into a sheet of desired thickness (for instance, several tens of micron to several hundreds of micron) by screen printing. A first quantum dots layer 103 is on top of the first conventional phosphor layer 102. The first quantum dots layer 103 contains quantum dots 106 that have a red fluorescent spectrum between 550 nm to 750 nm, dispersed in a matrix material 107. A calculated amount of dry quantum dots 106 of CdSe or ZnS are weighed out and then diluted into an organic solvent such as toluene in a container such as a laboratory flask in an enclosed chamber under a chemical hood. A calculated amount of uncured polymer base material 109, such as but not limited to condensation cured silicone or polymethyl methacrylate (PMMA), is added into the flask and mixed thoroughly till the base polymer is dissolved evenly in the solvent. The mixed solution is coated on the first conventional phosphor layer 102 described above by spin coating, print-plot or spade application. The quantum dots coating is dried under the condition of either room temperature, elevated temperature or UV exposure, depending on the polymer curing condition requirements, to form the first quantum dots layer 103. A second conventional phosphor layer 104 fabricated as described above is bonded on the top of the first quantum dots layer 103 using an adhesive such as silicone to form the layered structure that contains layers 102, 103 and 104. Then, the layered structure is diced into a desired geometry and bonded directly to the top of the blue LED chip 101 using adhesive such as silicone. The second conventional phosphor layer 104 may contain the same cool white phosphors 105 as in the first conventional phosphor layer 102 to convert some of the blue light emitted from the blue LED chip 101 to yellow region.

The average diameter of the conventional phosphor particles 105 may be 20 or more times the average diameter of the quantum dots. The conventional phosphor particles 105 in both conventional phosphor layers 102, 104 are large enough so that the light travelling through the layer is scattered by the conventional phosphor particles 105 without noticeable energy loss. Preferably, the average diameter of the conventional phosphor particle 105 is in a range of from 1 micrometer to 100 micrometers, which is a common size distribution for commercially available conventional LED phosphor particles.

Due to the multiple isotropic scattering process of light in the first and second conventional phosphor layer 102, 104, light goes back and forth between the two conventional phosphor layers 102, 104 and thus travels multiple times through the quantum dots layer 103. This phenomenon enhances the light absorption and conversion of the quantum dots layer 103, permitting a thinner quantum dots layer or less quantum dots particles needed to achieve the desired color. Furthermore, due to multiple scattering events between the two conventional phosphor layers 102, 104, the optical path and the angles of scattering of the light is randomized and independent of angle of incidence into the layers or angle of emission out of the layers. The scattering events within the second conventional phosphor layer 104 on the top of the first quantum dots layer 103 further average out the probability of the angle of emission, regardless of the direction of the light coming from the first quantum dots layer 103. Thus for light rays (i.e. photons) emitted at a certain angle of emission, the average optical path lengths in respective layers and therefore the average probabilities to be converted by conventional phosphors and quantum dots are independent of angle of emission. The percentage of output light converted by conventional phosphors and quantum dots, at certain angle of emission, is independent of the angle of emission. This results an output light with a more uniform color distribution. Therefore, the problem of non-uniform color distribution is substantially reduced or nearly eliminated.

Optionally, the conventional phosphor layers and the quantum dots layer 102, 103, 104 may further contain optical scatterers 108 to further enhance the scattering. Any one of the phosphor layers 102, 104 and quantum dots layer 103 may contain scatterers 108, two or more of these layers may do so, or all three layers may. The scatterers 108 may be made of $TiO_2$ particles or glass beads. The preferred average size of the scatterers 108 may be in a range of 1 micrometer to 100 micrometers.

The conventional phosphor layers 102, 104 can be fabricated in various of known ways. For instance, the conventional phosphor particles 105 can be mixed into plastic materials or polymer materials. Then the mixture is printed, extruded or pressed into film with the desired thickness. The film is cut into the desired shape depending upon the application. In another instance, a translucent ceramic powder, such as $Al_2O_3$, is mixed with phosphor powder. The mixture is then sintered under high temperature and high pressure in a mold to form a film with the desired thickness and geometry. In yet another instance, a mother glass containing a specific mole percentage of rare earth elements is treated at very high temperature and then molded or pressed into plates with the desired thickness. In still another instance, a phosphor powder is mixed with a glass powder. The mixture is heated and softened to provide an integrated material. Subsequently the integrated material is solidified to provide a phosphor-dispersed glass with a desired thickness.

The quantum dots layers 103 can be fabricated in various ways. A calculated amount of commercially available dry quantum dots, for instance, CdSe or ZnS quantum dots from Ocean NanoTech, Inc., are weighed out and then diluted into organic solvent such as but not limited to chloroform, isopropyl alcohol, or toluene in a container such as laboratory flask in an enclosed chamber under a chemical hood. A calculated amount of uncured base material, such as but not limited to condensation cured silicone or polymethyl methacrylate (PMMA), is added into the flask and mixed thoroughly till the base polymer is dissolved evenly in the solvent. The mixed solution is coated on a substrate, including a conventional phosphor layer, by spin coating, print-plot or spade application. The mixed solution is dried under conditions such as room temperature, elevated temperature or UV exposure, depending on the polymer curing condition requirements. The base material may also be another polymer, silicone, silica glass, silica gel, or glass.

The YAG:Ce phosphor may be mixed with silicone with a weight percentage of 35-65%. The thickness of the conventional phosphor layers 102, 104 may be 40-75 μm. The sparser the phosphor, the thicker the phosphor layer that is needed for sufficient light conversion under a targeted CCT. The CdSe or CdS quantum dots may be mixed with silicone with a weight percentage of 10-40%. The thickness of the quantum dots layer 103 may be 50 μm to several hundred micrometers. The sparser the quantum dots, the thicker the quantum dots layer is needed for sufficient light conversion under a targeted CCT.

Figure 2:
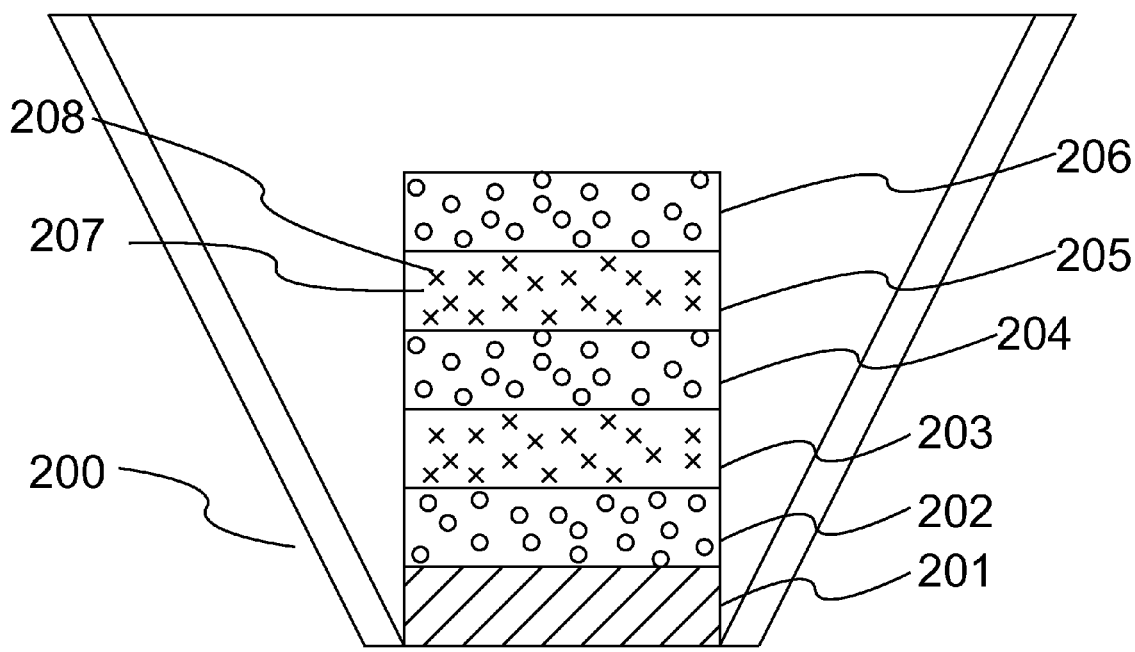
FIG. 2 is a schematic illustration of a lighting device according to another embodiment of the present disclosure.

In another embodiment, the lighting device 200 contain additional conventional phosphor layers and quantum dots layers as shown in FIG. 2. For instance, the lighting device 200 contains a second quantum dots layer 205 directly on top of the second conventional phosphor layer 204. The second quantum dots layer 205 includes at least one population of quantum dots 208 dispersed in a second matrix material 207. The second quantum dots layer may have the same or similar chemical composition as the first quantum dots layer 203. The lighting device 200 contains a third conventional phosphor layer 206 directly on top of the second quantum dots layer 205. The third conventional phosphor layer may have the same chemical composition as the first or second conventional phosphor layer 202, 204. The structure of the lighting device 200 may be extended to include additional quantum dots layers and conventional phosphor layers on top in like manner.

In another embodiment, the light source may be a near-UV LED chip, emitting light at the wavelength of about 375 to 400 nm. The conventional phosphor layers may contain blue phosphor such as but not limited to $(Sr, Ca)_5(PO_4)_3CL:Eu$, $BaMgAl_{10}O_{17}:Eu$, $(Sr, Ba)_3MgSi_2O_8:Eu$, $(Ba, Ca, Mg)_{10}(PO_4)_3Cl_2:Eu$, $BaMgSi_4O_{10}:Eu^{2+}$, and green phosphor such as but not limited to $SrGa_2S_4:Eu$, $Zn_2GeO_4:Mn$, $BaMgAl_{10}O_{17}:Eu,Mn$, to convert the UV light emitted from the UV LED chip to visible light. The quantum dots layer contains quantum dots that have a red fluorescent spectrum.

Figure 3:
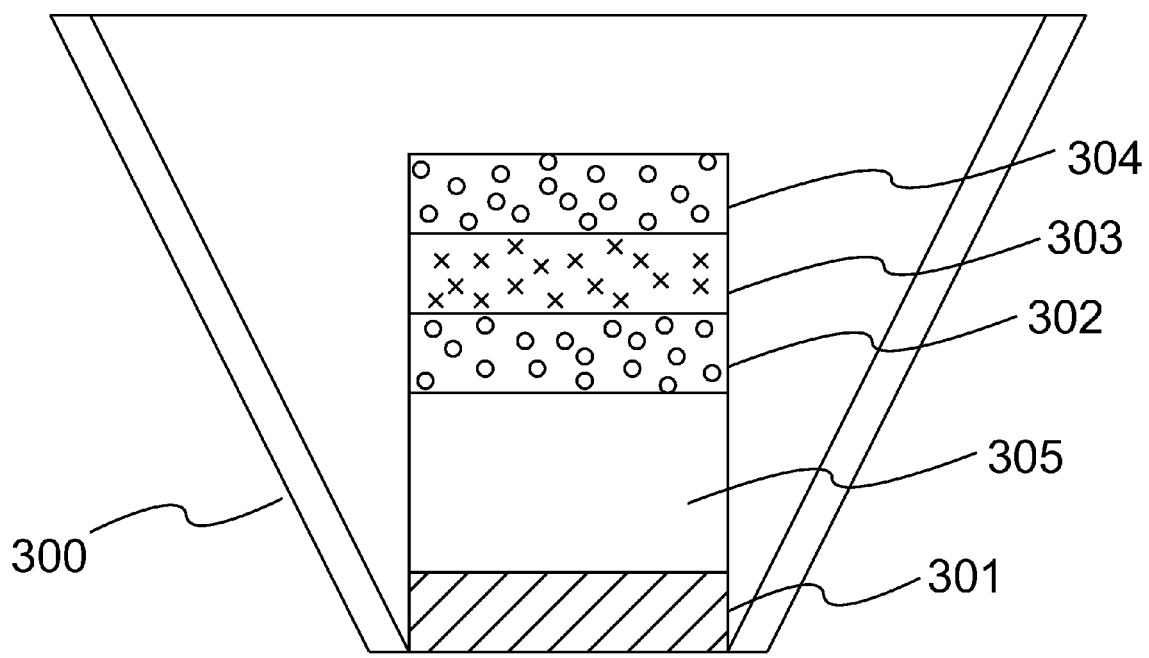
FIG. 3 is a schematic illustration of a lighting device according to another embodiment of the present disclosure.

Another embodiment is shown in FIG. 3. A first conventional phosphor layer 302 is disposed indirectly on top of LED chip 301. The term "indirectly" means that the phosphor layer is not in direct contact of the surface of the LED chip, but at a desired distance from the LED chip. Thus, the phosphor is a remote phosphor. There may be polymer, resin, encapsulant, gas or vacuum between the first conventional phosphor layer 302 and the LED chip 301. The preferred encapsulant 305 is silicone. A first quantum dots layer 303 is directly on top of the first conventional phosphor layer 302. A second conventional phosphor layer 304 is directly on top of the quantum dots layer. The second conventional phosphor layer 304 may contain the same phosphors as ones in the first conventional phosphor layer 302. The layered structure containing 302, 303 and 304 may be bonded to top of the encapsulant 305 using adhesive such as silicone, or mechanically mounted above the LED chip 301 at a distance using a mechanical mounting device such as a retainer ring. Optionally, the lighting device 300 may contain more conventional phosphor layers and quantum dots layers.

Figure 4:
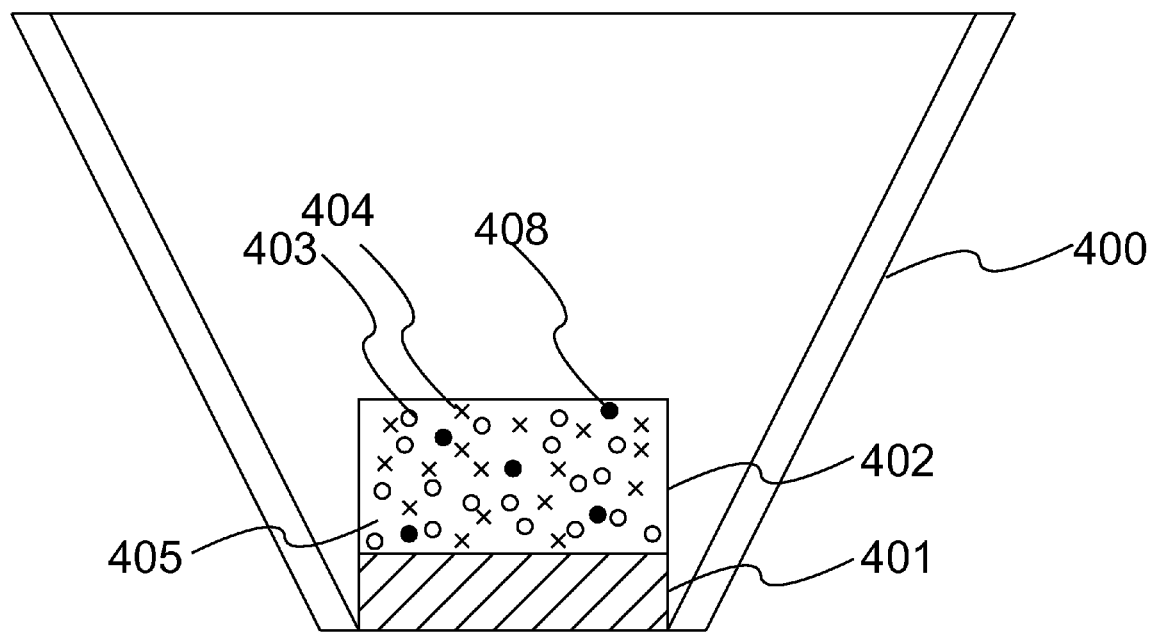
FIG. 4 is a schematic illustration of a lighting device according to another embodiment of the present disclosure.

With reference to FIG. 4, a lighting device 400, such as a lamp, in accordance with an embodiment is shown. The lighting device 400 includes a light source, which can be LEDs, laser diodes, organic LEDs or discharge lamps, preferably one or more LEDs. As shown in FIG. 4, LED chip 401 is the light source, preferably a blue GaInN LED chip, emitting light at the wavelength of about 430~485 nm.

A wavelength-shifting phosphor layer 402 containing both conventional phosphor particles 403 and quantum dots 404 is disposed directly on top of the LED chip 401. A calculated amount of dry quantum dots of CdSe or ZnS are weighed out and then diluted into organic solvent such as toluene in a laboratory flask in an enclosed chamber under a chemical hood. A calculated amount of uncured polymer base material, such as but not limited to condensation cured silicone, polymethyl methacrylate (PMMA), is added into the flask and mixed thoroughly till the base polymer is dissolved evenly in the solvent to form mixture #1. Meanwhile, a calculated amount of conventional phosphor powder is uniformly mixed into the same type of polymer base material as in the quantum dots mixture to form mixture #2. Then mixture #2 is carefully poured into the flask containing mixture #1 and then stirred to be mixed thoroughly with mixture #1. Then, the mixed solution is coated on a transparent substrate such as glass or plastics by spin coating, screen printing, or spade application and then dried at a desired curing temperature to form a uniform layer with desired thickness. The sheet is diced into a desired geometry and may be bonded on the top of the LED chip by adhesives such as silicone or PMMA. Conventional phosphor particles 403 and quantum dots 404 are dispersed in a matrix material 405. The average diameter of the conventional phosphor particles 403 is at least 20 times of the average diameter of the quantum dots 404. The conventional phosphor particles 403 are large enough so that the light travelling through the layer is scattered by the conventional phosphor particles 403 without noticeable energy loss. Preferably, the average diameter of the conventional phosphor particle 403 is in a range of from 1 micrometer to 100 micrometers.

Due to the multiple isotropic light scattering of light by the conventional phosphor particles in the wavelength-shifting phosphor layer 402, the optical path and the angles of scattering of the light is randomized. The overall length of the randomized optical path is substantially larger than the thickness of the wavelength-shifting phosphor layer 402. This phenomenon enhances the light absorption and conversion of the quantum dots, resulting in a thinner layer or less quantum dots particles needed to achieve the desired color. Furthermore, the multiple scattering events randomize the angles of scattered light and therefore the angle of emission out of the layer 402. Thus for light rays (i.e. photons) emitted at a certain angle of emission, the average optical path length in layer 402 and the average probabilities to be converted by conventional phosphors and quantum dots are independent of angle of emission. This results an output light with a more uniform color distribution. Therefore, the problem of non-uniform color distribution is substantially reduced or nearly eliminated.

Optionally, the wavelength-shifting phosphor layer 402 may further contain optical scatterers 408 to further enhance the scattering. The scatterers 408 may be made of TiO2 particles or glass beads. The preferred average size of the scatterers 408 may be in a range of 1 micrometer to 100 micrometers.

In an embodiment, the wavelength-shifting phosphor layer 402 may be disposed indirectly on top of the LED chip. There may be polymer, resin, encapsulant, gas or vacuum between the wavelength-shifting phosphor layer and the LED chip. The preferred encapsulant is silicone.

While a preferred embodiment described herein is for conventional phosphors made of garnet-based phosphor, the embodiment may be extended to other conventional phosphors such as silicate-based phosphor, orthosilicate-based phosphor, thiogallate-based phosphor, sulfide-based phosphor, or nitride-based phosphor. While a preferred embodiment described herein a method for preparing conventional phosphors, the embodiment may be extended to other phosphor preparation methods within the knowledge of the person of ordinary skill in the art.

While a preferred embodiment described herein is for quantum dots made with CdSe or ZnS in the polymer matrix such as PMMA, the embodiment may be extended to other quantum dots with chemical compositions of CdS, CdSe, CdTe, CdPo, ZnS, ZnSe, ZnTe, ZnPo, HgS, HgSe, HgTe, MgS, MgSe, MgTe, PbSe, PbS, PbTe, GaN, GaP, GaAs, InP, InAs, CuInS$_2$, CdS$_{1-x}$Se$_x$, BaTiO$_3$, PbZrO$_3$, PbZr$_x$Ti$_{1-x}$O$_3$, Ba$_x$Sr$_{1-x}$TiO$_3$, SrTiO$_3$, LaMnO$_3$, CaMnO$_3$, Or La$_{1-x}$Ca$_x$MnO$_3$. The embodiment may be extended to quantum dots made by production methods such as colloidal synthesis, advanced epitaxial nanocrystals, ion implantation, lithographic technique, viral assembly, or electrochemical assembly. While a preferred embodiment described herein discloses a method for preparing a quantum dots layer, the embodiment may be extended to other quantum dots layer preparation methods within the knowledge of the person of ordinary skill in the art.

An example of synthesizing ZnS quantum dots is as follows. Elemental sulfur and oleylamine are added to a vial and sonicated until the sulfur dissolves. Zinc oleate, oleic acid and oleylamine are added into a flask and heated at 200° C. under nitrogen. The sulfur solution is injected into the solution in the flask and the flask is heated at 300° C. for 1 hour. Then the solution is cooled to 70° C. Acetone is added to the cooled solution and thoroughly stirred. Methanol is added to the solution to precipitate the nanocrystals. The mixture is centrifuged at and the supernatant is decanted off. The precipitate is washed with acetone and re-dispersed in hexane.

While the principles of the present disclosure have been described herein, it is to be understood by those skilled in the art that this description is made only by way of example and not as a limitation as to its scope. Reference numerals corresponding to the embodiments described herein may be provided in the following claims as a means of convenient reference to the examples of the claimed subject matter shown in the drawings. It is to be understood however, that the reference numerals are not intended to limit the scope of the claims. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the recitations of the following claims.

The following is a non-limiting list of reference numerals used in the specification:
100 lighting device
101 light source
102 first conventional phosphor layer
103 first quantum dots layer
104 second conventional phosphor layer
105 phosphor particles
106 quantum dots
107 matrix material
108 scatterers
200 lighting device
201 light source
202 first conventional phosphor layer
203 first quantum dots layer
204 second conventional phosphor layer
205 second quantum dots layer
206 third conventional phosphor layer
207 second matrix material
208 quantum dots
300 lighting device
301 light source
302 first conventional phosphor layer
303 first quantum dots layer
304 second conventional phosphor layer
305 encapsulant
400 lighting device
401 light source
402 wavelength-shifting phosphor layer
403 conventional phosphor particles
404 quantum dots
405 matrix material
408 scatterers

What is claimed is:

1. A lighting device (100) comprising:
a light-emitting source (101);
a first phosphor layer (102) disposed either directly or indirectly on top of the light source (101);
a first quantum dots layer (103) disposed directly on top of the first phosphor layer (101), the first quantum dots layer (103) comprising at least one population of quantum dots (106) dispersed in a first matrix material (107);
a second phosphor layer (104) disposed directly on top of the first quantum dots layer (103), the first and second phosphor layers (102), (104) each comprising at least one population of phosphor particles (105); and
a second quantum dots layer (205) disposed directly on top of the second phosphor layer (204), the second quantum dots layer (205) comprising at least one population of quantum dots (208) dispersed in a second matrix material (207).

2. The lighting device (100) of claim 1, wherein an average diameter of the conventional phosphor particles (105) is at least 20 times an average diameter of the quantum dots (106).

3. The lighting device (100) of claim 1, wherein an average size of the phosphor particles (105) is in a range of 1 micrometer to 100 micrometers.

4. The lighting device (100) of claim 1, wherein the quantum dots (106) comprise at least one material selected from the group consisting of CdS, CdSe, CdTe, CdPo, ZnS, ZnSe, ZnTe, ZnPo, HgS, HgSe, HgTe, MgS, MgSe, MgTe, PbSe, PbS, PbTe, GaN, GaP, GaAs, InP, InAs, CuInS$_2$, CdS$_{1-x}$Se$_x$, BaTiO$_3$, PbZrO$_3$, PbZr$_x$Ti$_{1-x}$O$_3$, Ba$_x$Sr$_{1-x}$TiO$_3$, SrTiO$_3$, LaMnO$_3$, CaMnO$_3$, and La$_{1-x}$Ca$_x$MnO$_3$.

5. The lighting device (100) of claim 1, wherein the light source (101) comprises at least one device selected from the group consisting of a light emitting diode, a laser diode, an organic light emitting diode, and a discharge lamp.

6. The lighting device (100) of claim 5, wherein the light emitting diode (101) is a device selected from the group consisting of a blue light emitting diode and a UV light emitting diode.

7. The lighting device (100) of claim 1, wherein the first matrix material (107) comprises at least one material selected from the group consisting of polymethyl methacrylate, polymer, condensation cured silicone, silicone, silica glass, silica gel, and glass.

8. The lighting device (100) of claim 1, wherein the first and second phosphor layers (102), (104) comprise phosphor particles (105) comprising YAG:Ce, and the first quantum dots layer (103) comprises quantum dots (106) having a red fluorescent spectrum.

9. The lighting device (100) of claim 1, wherein the first phosphor layer (102) comprises at least one material selected from the group consisting of garnet-based phosphor, silicate-based phosphor, orthosilicate-based phosphor, thiogallate-based phosphor, sulfide-based phosphor, and nitride-based phosphor; and the second phosphor layer (104) comprises at least one material selected from the group consisting of garnet-based phosphor, silicate-based phosphor, orthosilicate-based phosphor, thiogallate-based phosphor, sulfide-based phosphor, and nitride-based phosphor.

10. The lighting device (100) of claim 1, wherein each of the first phosphor layer (102), the second phosphor layer 104 and the first quantum dots layer (103) further comprises scatterers (108).

11. The lighting device (100) of claim 10, wherein an average size of the scatterers (108) is in a range of 1 micrometer to 100 micrometers, and the scatterers (108) comprise at least one material selected from the group consisting of $TiO_2$ and glass.

12. The lighting device (200) of claim 1, further comprising:
   a third phosphor layer (206) disposed directly on top of the second quantum dots layer (205).

13. The lighting device (400) of claim 1, further comprising:
   a wavelength-shifting phosphor layer (402) disposed either directly or indirectly on top of the light source (401), the wavelength-shifting phosphor layer (402) comprising:
      at least one population of quantum dots (404) dispersed in a matrix material (405); and
      at least one population of phosphor particles (403) dispersed in the matrix material (405), an average diameter of the phosphor particles (403) being at least 20 times an average diameter of the quantum dots (404).

* * * * *